United States Patent
Mather et al.

(10) Patent No.: US 8,119,424 B2
(45) Date of Patent: Feb. 21, 2012

(54) ELECTRONIC DEVICE INCLUDING A MAGNETO-RESISTIVE MEMORY DEVICE AND A PROCESS FOR FORMING THE ELECTRONIC DEVICE

(75) Inventors: Phillip G. Mather, Maricopa, AZ (US); Sanjeev Aggarwal, Scottsdale, AZ (US); Brian R. Butcher, Queen Creek, AZ (US); Renu W. Dave, Chandler, AZ (US); Frederick B. Mancoff, Chandler, AZ (US); Nicholas D. Rizzo, Gilbert, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 490 days.

(21) Appl. No.: 11/864,409

(22) Filed: Sep. 28, 2007

(65) Prior Publication Data

US 2009/0085058 A1    Apr. 2, 2009

(51) Int. Cl.
*H01L 21/00* (2006.01)
(52) U.S. Cl. .............. 438/3; 438/381; 257/E21.665
(58) Field of Classification Search ............. 438/3, 381; 257/E21.665
See application file for complete search history.

(56) References Cited

U.S. PATENT DOCUMENTS

| | | | |
|---|---|---|---|
| 7,001,783 B2 | 2/2006 | Costrini et al. | |
| 7,097,777 B2 | 8/2006 | Costrini et al. | |
| 7,122,854 B2 * | 10/2006 | Fukuzumi | 257/295 |
| 2004/0084400 A1 | 5/2004 | Costrini et al. | |
| 2004/0150922 A1 * | 8/2004 | Kagami et al. | 360/324.2 |
| 2005/0276099 A1 * | 12/2005 | Horng et al. | 365/158 |
| 2007/0000120 A1 | 1/2007 | Blanchard | |

FOREIGN PATENT DOCUMENTS

WO    2004040602 A2    5/2004

OTHER PUBLICATIONS

Andre, Thomas W. et al. "A 4-Mb 0.18-um 1T1MTJ Toggle MRAM with Balanced Three Input Sensing Scheme and Locally Mirrored Unidirectional Write Drivers," IEEE Journal of Solid-State Circuits, vol. 40, No. 1, pp. 301-309, Jan. 2005.

* cited by examiner

*Primary Examiner* — Julia Slutsker
(74) *Attorney, Agent, or Firm* — Ingrassia Fisher & Lorenz, P.C.

(57) ABSTRACT

A process of forming an electronic device can include forming a stack including a tunnel barrier layer. The tunnel barrier layer can have a ratio of the metal atoms to oxygen atoms of greater than a stoichiometric ratio, wherein the ratio has a particular value. The process can also include forming a gettering layer having a composition capable of gettering oxygen, and depositing an insulating layer over the gettering layer. The process can further include exposing the insulating layer to a temperature of at least approximately 60° C. In one embodiment, after such exposure, a portion of the gettering layer is converted to an insulating material. In another embodiment, an electronic device can include a magnetic tunnel junction and an adjacent insulating layer lying within an opening in another insulating layer.

14 Claims, 5 Drawing Sheets

ELECTRONIC DEVICE INCLUDING A MAGNETO-RESISTIVE MEMORY DEVICE AND A PROCESS FOR FORMING THE ELECTRONIC DEVICE

BACKGROUND

1. Field of the Disclosure

The present disclosure relates to electronic devices, and more particularly to electronic devices that include magneto-resistive memory devices and processes for forming them.

2. Description of the Related Art

Magneto-resistive random access memory ("MRAM") cells operate by measuring the current passing through a magnetic tunnel junction including a tunnel barrier layer lying between a fixed magnetic layer and a free magnetic layer. The fixed magnetic layer has its magnetization pinned in a particular orientation or direction, and the free magnetic layer has its magnetization in either the same or a different orientation as compared to the fixed magnetic layer. The effective resistance of the magnetic tunnel junction is different depending on whether the magnetizations of the free layer and the fixed layer are aligned or not. Thus, the MRAM cell can be programmed by setting the magnetization of the free layer in a desired direction.

In a spin-transfer MRAM (STMRAM) cell, the magnetization of the free layer can be programmed by passing a large amount of current through the magnetic tunnel junction relative to the current used during a read operation. Catastrophic breakdown of the tunnel junction layer becomes likely as the lower end of the breakdown voltage distribution extends into the upper end of the write voltage distribution within a STMRAM memory array. Significant separation between these two distributions is required for reliable STMRAM operation. Changes in materials and device characteristics during processing can reduce the separation, or increase the overlap between these voltage distributions, making such events more likely.

In particular, the tunnel current required to cause a switching event is dependent upon the magnetic volume of the free layer, while the voltage that must be sustained across the tunnel barrier layer during a switching event is dependent upon the tunnel barrier active area. If the tunnel barrier area is smaller than the magnetic area, the STMRAM operation will be adversely impacted. Such a difference can arise during high temperature processing steps when an ultra-thin or under-oxidized metal oxide is exposed to an adjacent insulating layer. Under-oxidized tunnel barriers having low resistance area product (RA) are common in STMRAM since the switching voltage $V_{sw} \propto RA$. Oxygen (or nitrogen) may diffuse from the insulating layer into the edges of the tunnel barrier layer, locally increasing its RA product and reducing the available active area for electron tunneling. Hence, the required tunnel current for switching must pass through a reduced area, causing an increase in $V_{sw}$ for the same average breakdown voltage $V_{bd}$.

Accordingly, it is desirable to provide an STMRAM device structure having a tunnel barrier whose active area is not significantly decreased due to subsequent processing. It is also desirable to provide a method for fabricating an STMRAM device that has an active area that is not significantly reduced due to subsequent processing.

BRIEF DESCRIPTION OF THE DRAWINGS

The present disclosure may be better understood, and its numerous features and advantages made apparent to those skilled in the art by referencing the accompanying drawings. The subject of the disclosure is illustrated by way of example and not limitation in the accompanying figures.

Figure 1:
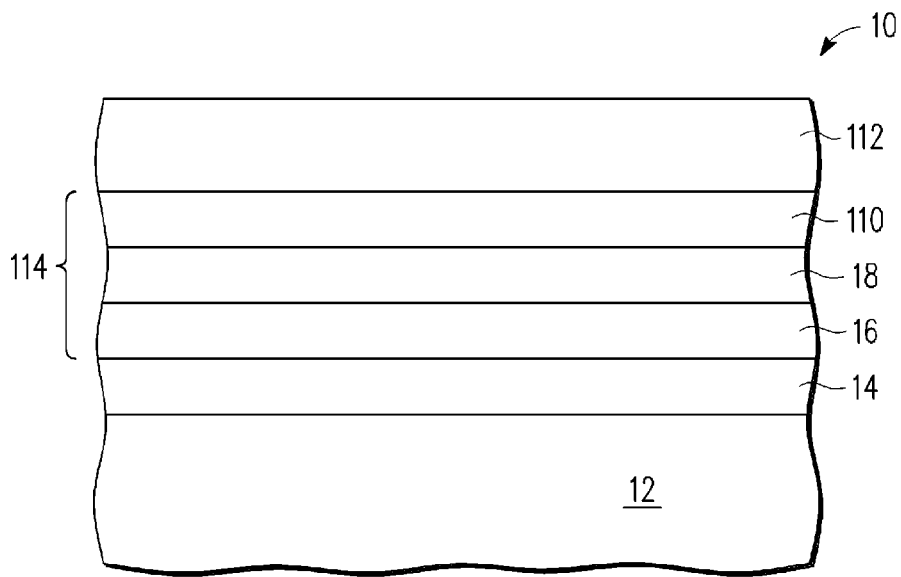
FIG. 1 includes an illustration of a cross-sectional view of a workpiece including a magnetic stack between a first electrode layer and a second electrode layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

A process of forming the electronic device can include forming a gettering layer, capable of gettering oxygen, adjacent to a magnetic stack including a tunnel barrier layer. In a particular embodiment, the gettering layer lies between the tunnel barrier layer and an insulating layer. The tunnel barrier layer can include an under-oxidized metal, which comprises a material having a ratio of metal atoms to oxygen/nitrogen atoms of greater than the stoichiometric ratio of the fully oxidized/nitrodized metal. By forming the gettering layer, further oxidation of a previously deposited layer, such as the tunnel barrier layer, during subsequent processing can be reduced or substantially avoided, and electrical properties of the previously deposited layer can be substantially maintained. By substantially preserving the as deposited electrical properties, process induced variation in the resistance of the MRAM cells through lateral encroachment can be reduced or substantially eliminated.

In one embodiment, after depositing an insulating layer over the gettering layer and annealing the insulating layer, or after the high temperature process intrinsic to the deposition of the insulating layer, the tunnel barrier layer of the magnetic tunnel junction of a magnetic stack can have substantially the same active area or resistance as before deposition of the insulating layer. In another embodiment, the gettering layer can be formed such that after depositing an insulating layer over the gettering layer and annealing the insulating layer, substantially all of the gettering layer is converted to an insulating material. In a particular embodiment, a conductive material can be used to form the gettering layer that is subsequently converted to an insulating material after performing an anneal. By selecting the thickness of the gettering layer such that substantially all of the material of the gettering layer is converted to form an insulating material, the gettering layer can be deposited extending between structures that are not intended to be electrically connected to one another in the completed electronic device. In another particular embodiment, an oxygen-containing material can be removed from an exposed surface over the magnetic stack prior to forming the gettering layer.

In accordance with still another embodiment, an electronic device can include a portion of a magnetic tunnel junction within an opening in an insulating layer. Another insulating layer can lie adjacent to the magnetic tunnel junction within the opening. In a particular embodiment, the other insulating layer can include a metal oxide. Specific embodiments of the present disclosure will be better understood with reference to FIGS. 1 through 10.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

FIG. 1 includes an illustration of a cross-sectional view of a workpiece 10, the central part of the magnetic tunnel junction, including a substrate 12, an electrode layer 14, a magnetic layer 16, a tunnel barrier layer 18, a magnetic layer 110, and an electrode layer 112. The substrate 12 includes a semiconductor material such as silicon, germanium, carbon, another semiconductor material, such as a III-V or a II-VI material, or any combination thereof. The substrate 12 includes a monocrystalline semiconductor substrate, a semiconductor on sapphire substrate, a semiconductor on insulator substrate, or another substrate structure typically used for forming electronic devices. In one embodiment, the substrate 12 includes either fully or partially depleted n-type active semiconductor region, p-type active semiconductor region, or any combination thereof. The substrate 12 has a thickness in a range of approximately 500 to approximately 800 microns. The substrate 12 may include other layers such as doping regions, interconnect layers, texturing layers, and a multitude of other layers not explicitly mentioned in this description. Although not illustrated, in one embodiment, a conventional or proprietary electronic component is formed at the substrate 12 that can be used to regulate current flow to a subsequently formed magneto-resistive component.

The electrode layer 14 is formed over the substrate 12. Although not illustrated, the substrate 12 can include an insulating layer, a conducting layer, or any combination thereof. The electrode layer 14 includes a conventional or proprietary conductive material and can serve as an electrode for a subsequently formed magneto-resistive electronic component. The conductive material can include heavily doped silicon, aluminum, copper, titanium, tungsten, tantalum, or any combination thereof. The electrode layer 14 can be formed using a conventional or proprietary physical vapor deposition ("PVD") process, chemical vapor deposition ("CVD") process, atomic layer deposition ("ALD") process, or any combination thereof. The electrode layer 14 can have a thickness in a range of approximately 3 to approximately 300 nm. In a particular embodiment, the electrode layer 14 can have a thickness in a range of approximately 10 to approximately 60 nm.

The magnetic layer 16 is formed over the electrode layer 14. The magnetic layer 16 includes a material having a magnetization and can serve as a portion of a subsequently formed magnetic tunnel junction. In one embodiment, the magnetic layer 16 contains a pinning layer, a pinned layer, a coupling layer, and a fixed layer, having a magnetization fixed in one particular orientation. Although not illustrated, this magnetic layer may utilize an antiferromagnetic pinning layer and a synthetic antiferromagnet to prevent the magnetization from changing orientation of the fixed layer. The magnetic layer 16 can include platinum, manganese, iridium, boron, cobalt, iron, nickel, ruthenium, rhodium, osmium, other magnetic materials, or any combination thereof. The magnetic layer 16 can be deposited using a conventional or proprietary CVD process, a PVD process, an ALD process, an ion beam deposition ("IBD") process, other deposition processes, or any combination thereof. The magnetic layer 16 has a thickness in a range of approximately 1 to approximately 50 nm, and in a particular embodiment, has a thickness in a range of approximately 20 to approximately 30 nm.

The tunnel barrier layer 18 is formed over the magnetic layer 16. The tunnel barrier layer 18 includes a tunnel barrier material that is used in determining the overall device RA product and the resistance change between parallel and anti-parallel magnetic configurations of the magnetic electrodes. In one embodiment, the tunnel barrier layer includes a metal oxide that is underoxidized. In a particular embodiment, the amount of oxidation of the metal is selected such that the RA product of the tunnel barrier layer lies within a specified range of 1 to 100 $\Omega\text{-}\mu m^2$. The metal oxide can include titanium, aluminum, magnesium, zirconium, hafnium, tantalum, or any combination thereof. The metal oxide can also include Nitrogen, such that it can be referred to as a metal oxynitride barrier.

In a particular embodiment, the tunnel barrier layer 18 can be formed by depositing a metal layer and subsequently partially and not fully oxidizing the layer. For example, the metal layer can be deposited by a conventional or proprietary CVD process, PVD process, ALD process, an IBD process, or any combination thereof. The metal layer is exposed to an oxygen source. Exposing the metal layer to the oxygen source can be performed using diffusion, convection, implantation, oxygen plasma, or any combination thereof. The oxygen source can include substantially pure oxygen (e.g., $O^{-2}$, $O_2$ or $O_3$), or an oxygen-containing compound (e.g., water or nitrous oxide). The oxygen source can also include a diluent, such as a carrier gas. Oxygen may also be presented in a plasma form. Oxygen from the oxygen source can react with the metal layer to form a metal oxide with a desired ratio of metal atoms to oxygen atoms.

In another embodiment, the tunnel barrier layer 18 can be deposited by sputtering a material from a target of an appropriate metal oxide composition. The tunnel barrier layer 18 has a thickness in a range of approximately 0.5 to approximately 5 nm. In a particular embodiment, the tunnel barrier layer 18 has a RA product of not greater than 100 $\Omega$-$\mu m^2$. In yet another embodiment, the tunnel barrier layer can also comprise a multilayer of pure metal and metal oxide layers.

The magnetic layer 110 is formed over the tunnel barrier layer 18. The magnetic layer 110 includes a material with a magnetization and can serve as a portion of a subsequently formed magnetic tunnel junction. In a particular embodiment, the magnetic layer 110 is a free layer such that the magnetization can have one of a plurality of orientations and does not include a pinning layer to prevent the magnetization from changing orientation. The magnetic layer 110 can be formed using a material as described with respect to the magnetic layer 16. The magnetic layer 110 can include the same or a different material than the magnetic layer 16. The magnetic layer 110 can be formed using a conventional or proprietary CVD process, PVD process, ALD process, an IBD process, or any combination thereof. The magnetic layer 110 has a thickness in a range of 2 to 10 nm. The magnetic layer 110 can have a same or a different thickness than the magnetic layer 16. The magnetic layer 110 can also include a synthetic antiferromagnetic free layer that includes at least two separate magnetic layers that are antiferromagnetically coupled by a non-magnetic spacer. The magnetic layers of the antiferromagnet can have the same magnetic moment or have different magnetic moments.

The electrode layer 112 is formed over a magnetic layer 110. The electrode layer 112 includes a material as previously described with respect to the electrode layer 14, and is formed using an embodiment as previously described with respect to the electrode layer 14. The electrode layer 112 and the electrode layer 14 can be formed using a same or a different process and include a same or different material. In one embodiment, the electrode layer 112 has a thickness in a range of approximately 3 to approximately 300 nm. In a particular embodiment, the electrode layer 112 can have a thickness in a range of approximately 10 to approximately 60 nm.

A magnetic stack 114 lies between the electrode layer 112 and the electrode layer 14. As illustrated, the magnetic stack 114 includes the magnetic layer 16, the tunnel barrier layer 18, and the magnetic layer 110. A portion of the magnetic stack 114 can serve as a magnetic tunnel junction of a subsequently formed magnetic tunnel junction of an STMRAM cell. Furthermore, although not illustrated in FIG. 1, the magnetic stack may also contain an additional fixed magnetic layer and tunnel barrier layer located between the electrode layer 112 and the free magnetic layer 110. The additional fixed layer would contact the electrode layer 112, while the additional tunnel barrier layer would contact the magnetic layer 110. The additional fixed layer is similar in nature to magnetic layer 16, and the additional tunnel barrier layer is similar in nature to tunnel barrier layer 18. This configuration allows for greater efficiency of the spin-transfer effect and thus also a decrease in the current flow required for programming the bit.

Figure 2:
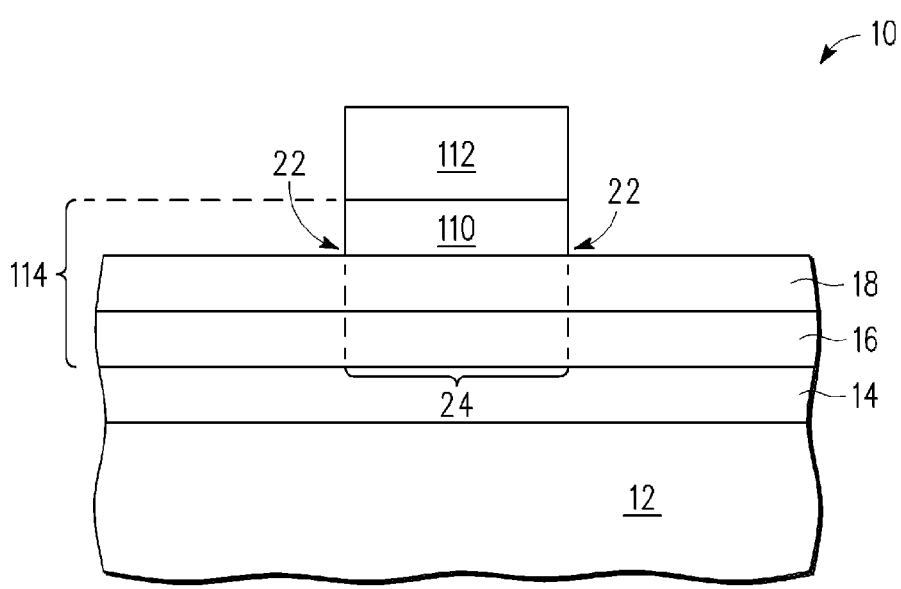
FIG. 2 includes an illustration of a cross-sectional view of the workpiece of FIG. 1 after removing a portion of the second electrode layer and the magnetic stack.

FIG. 2 includes an illustration of the workpiece 10 after removing a portion of the electrode layer 112 and the magnetic layer 110 of the magnetic stack 114. A patterned masking layer (not illustrated) is formed over the workpiece 10 using a conventional or proprietary lithographic process to protect portions of the electrode layer 112. Exposed portions of the electrode layer 112, and subsequently exposed portions of the magnetic stack 114 are removed to expose the tunnel barrier layer 18. As illustrated, a remaining portion of the magnetic layer 110 of the magnetic stack 114 has an edge 22. The remaining portion of the magnetic stack 114 includes a magnetic tunnel junction 24. Removal of the portion of the magnetic stack 114 can include a conventional or proprietary etch process. After forming the magnetic tunnel junction 24, the patterned masking layer is removed. At this point in the process, the tunnel barrier layer 18 has an initial active area that substantially corresponds to the area occupied by the magnetic tunnel junction 24, as seen from a top view of the electronic device. As used herein, the term "active area" with respect to the tunnel barrier layer, refers to the area of the tunnel barrier layer through which carriers (e.g., electrons) can tunnel.

Figure 3:
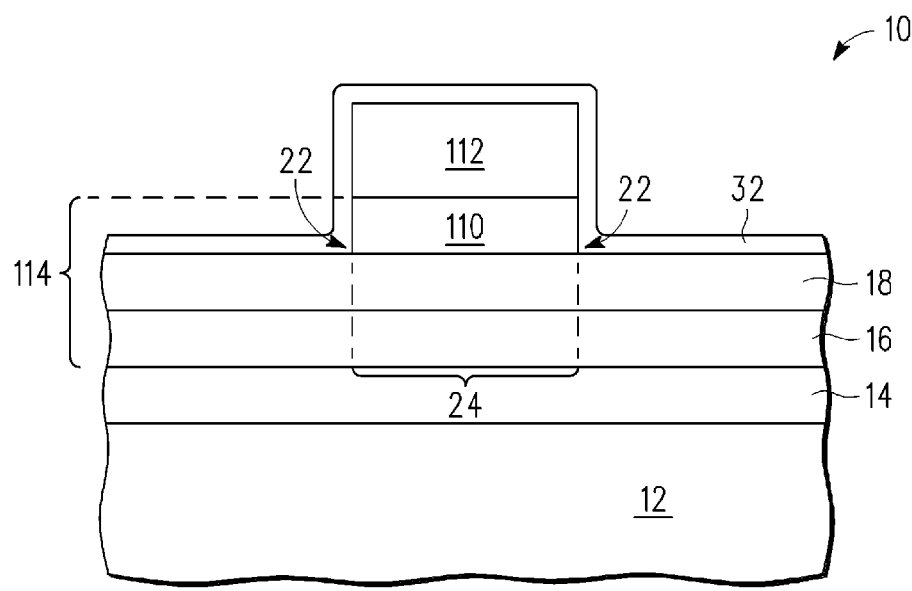
FIG. 3 includes an illustration of a cross-sectional view of the workpiece of FIG. 2 after forming a gettering layer over the magnetic stack.

FIG. 3 includes an illustration of the workpiece 10 after forming a gettering layer 32 adjacent to the magnetic stack 114. The gettering layer 32 can serve to getter material during subsequent processing that might otherwise undesirably react or otherwise interact with a portion of the tunnel barrier layer 18 or another portion of the electronic device. In one embodiment, the material of the gettering layer 32 is selected to have a higher affinity for combining with the material to be gettered than the tunnel barrier layer 18. In another particular embodiment, gettering layer 32 prevents material from reacting with the tunnel barrier layer edges that are in close proximity to edge 22. In a particular embodiment, the gettering layer 32 has a composition capable of gettering oxygen. Therefore, during subsequent formation of an otherwise unrelated oxide layer, oxygen, which could increase the resistance of the tunnel barrier layer 18 particularly near edge 22 and reduce the active area of the device, reacts with the gettering layer instead of the tunnel barrier layer 18. As a result, the tunnel barrier layer maintains substantially the same active area and resistance.

In another particular embodiment, the gettering layer 32 includes a conductive and highly reactive material, and more particularly a metal, such as magnesium, aluminum, titanium, tantalum, or any combination thereof. In a particular embodiment, the conductive material includes a partially oxidized, or under-oxidized metal layer, such as a magnesium oxide, an aluminum oxide, or any combination thereof with a ratio of metal atoms to oxygen atoms that is greater than the stoichiometric ratio of the fully oxidized metal. In another particular embodiment, the tunnel barrier layer 18 and the gettering layer 32 include the same metal.

In one embodiment, after removing the patterned masking layer previously described with respect to FIG. 2, an oxygen-containing material is removed from an exposed surface over the magnetic stack 114 prior to forming the gettering layer 32. The oxygen-containing material can be removed using a sputter etch process in a reduced pressure ambient environment. The oxygen-containing material can also include other materials such as nitrogen, water, a hydrocarbon, or the like. In a particular embodiment, the ambient environment during the sputter etch process includes using an inert gas component in the ambient environment, such as a noble gas.

The thickness of the gettering layer 32 is in a range of approximately 1 to approximately 10 nm. In a particular embodiment, the thickness can be selected such that after subsequent processing is completed, substantially all of the gettering layer 32 will have been converted to an insulating material. In another particular embodiment, after the subsequent conversion, the gettering layer 32 consists essentially of a metal oxide.

The gettering layer 32 is deposited over the magnetic tunnel junction 24 using a conventional or proprietary CVD process, PVD process, ALD process, an IBD process, or any combination thereof. In a particular embodiment, a PVD process is used, and the gettering layer 32 is sputtered at an acute incident angle to a major surface of the workpiece 10. In one embodiment, the angle is between approximately 5 and approximately 45 degrees from a direction perpendicular to the major surface of the substrate. By depositing the gettering layer 32 using such a process, the gettering layer 32 can be deposited along a side surface of an exposed structure of the workpiece 10, such as the magnetic tunnel junction 24. In a particular embodiment, the gettering layer 32 substantially covers the tunnel barrier layer 18.

Figure 4:
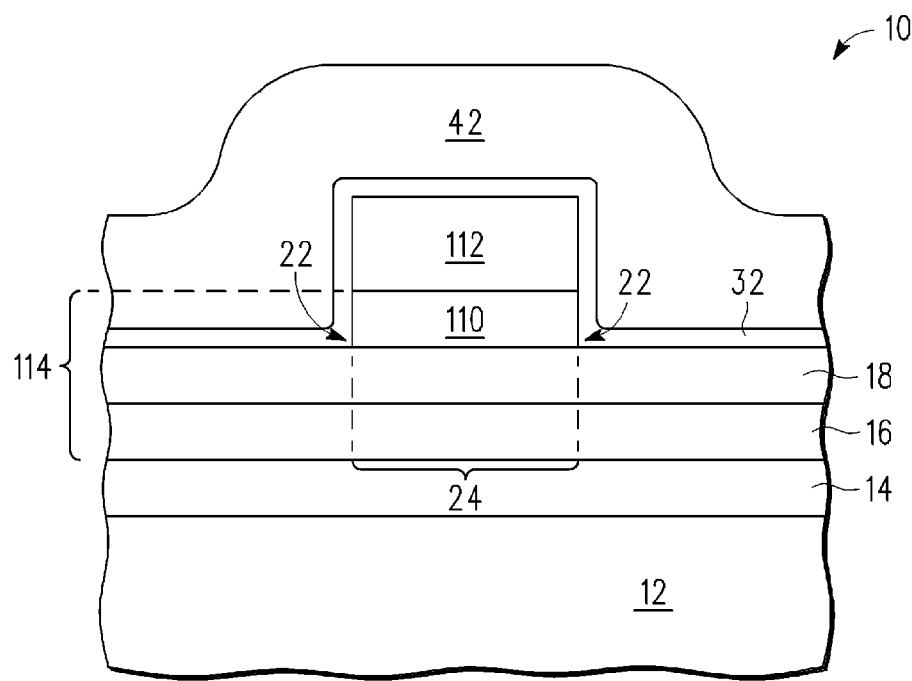
FIG. 4 includes an illustration of a cross-sectional view of the workpiece of FIG. 3 after depositing an insulating layer over the gettering layer.

FIG. 4 includes an illustration of the workpiece 10 after formation of an insulating layer 42 over the gettering layer 32. The insulating layer 42 can serve to electrically insulate portions of the workpiece 10 from each other, fill between structures of the workpiece 10, provide material for a subsequently performed planarization process, or any combination thereof. The insulating layer 42 includes an insulating material such as an oxide, a nitride, an oxynitride, or any combination thereof. The insulating layer 42 can be deposited using a conventional or proprietary CVD process, PVD process, ALD process, an IBD process, or any combination thereof. The thickness of the insulating layer 42 can be selected based on the elevation of the underlying structures such that after subsequent processing planarization of the workpiece 10 can be improved. In one embodiment, the thickness of the insulating layer 42 is not greater than 500 nm. In a particular embodiment, the insulating layer 42 has a thickness in a range of approximately 50 to approximately 250 nm.

In a particular embodiment, the insulating layer 42 includes an oxide. Oxygen or an oxygen-containing material is introduced to the process chamber during deposition of the insulating layer 42. As discussed above, oxygen can react or otherwise interact undesirably with the tunnel barrier layer 18, such that there is an adverse affect on the properties of the tunnel barrier layer 18. In particular, oxygen can react with the portion of the tunnel barrier layer 18 that is in close proximity to edge 22, thereby decreasing the tunnel barrier active area and increasing the resistance of the magnetic tunnel junction. Although not illustrated, in one embodiment, during the formation of the insulating layer 42, a portion of the gettering layer 32 can be converted to an insulating material.

Figure 5:
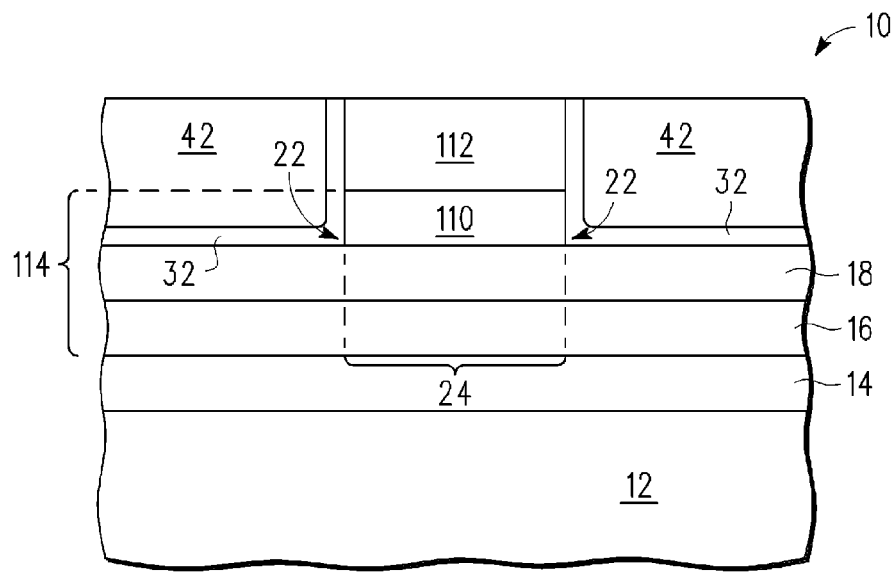
FIG. 5 includes an illustration of a cross-sectional view of the workpiece of FIG. 4 after removing a portion of the insulating layer and exposing the second electrode layer.

FIG. 5 includes an illustration of the workpiece 10 after exposing a remaining portion of the electrode layer 112 at an opening in the insulating layer 42. In one embodiment, the insulating layer 42 and a portion of the gettering layer 32 are removed from over the electrode layer 112 to expose the electrode layer 112 within the opening. In a particular embodiment, a portion of the magnetic tunnel junction 24 lies within the opening. Also, after removing the portion of the gettering layer 32, the remaining portion of the gettering layer 32 extends to the edge 22 of the magnetic tunnel junction 24. In a particular embodiment, a chemical mechanical planarization process (CMP) is used to form the opening in the insulating layer 42. In another embodiment, a patterned masking layer is formed, followed by a conventional or proprietary etch process to expose the electrode layer 112, followed by removal of the patterned masking layer.

In the illustrated embodiment, the workpiece 10 can be exposed to an elevated temperature after depositing the insulating layer 42 and during subsequent processing steps. This elevated temperature may be associated with any of the additional processing steps required to fabricate the STMRAM array. In one embodiment, the elevated temperature can be greater than 60° C. In another embodiment, the temperature can be in a range of approximately 200 to 300° C.

Oxygen or another reactive material can lie within the insulating layer 42 or another layer of the workpiece 10. Such material can diffuse or otherwise migrate to the gettering layer 32 and convert the gettering layer 32 from a conductive material to an insulating material. This conversion to the insulating material substantially eliminates a leakage pathway between the illustrated portion of the electrode layer 112 and an adjacent, non-illustrated portion of the electrode layer 112, and between magnetic layers 16 and 110. Because a portion of available reactive material is consumed by converting the conductive material of the gettering layer 32 to insulator, there is less reactive material available to react with the tunnel barrier layer 18 or another portion of the electronic device. In a more particular embodiment, after performing the anneals, the difference between the pre-anneal and the post-anneal active tunnel barrier areas is not more than 10 percent.

Figure 6:
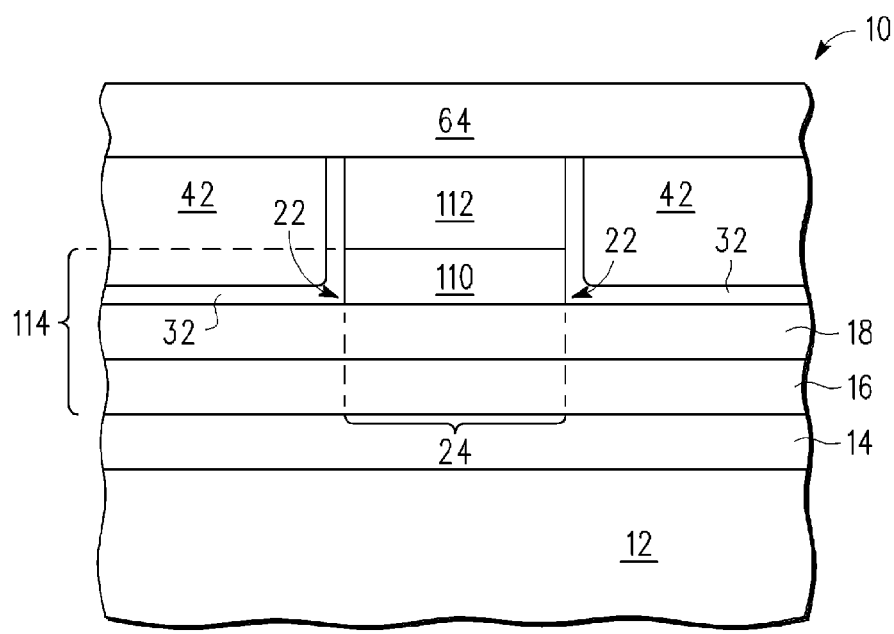
FIG. 6 includes an illustration of a cross-sectional view of the workpiece of FIG. 5 after forming an interconnect layer electrically connected to the second electrode layer.

FIG. 6 includes an illustration of the workpiece 10 after forming an interconnect layer 64. The interconnect layer 64 can act as an electrical connection for the remaining portion of the electrode layer 112 and the magnetic tunnel junction 24. The interconnect layer 64 includes a conductive material and can be formed using a CVD process, a PVD process, an ALD process, an IBD process, or any combination thereof. Although not illustrated, another insulating layer, another interconnect layer, an encapsulating layer, or any combination thereof may be formed by a conventional or proprietary process to form a substantially complete electronic device.

Figure 7:
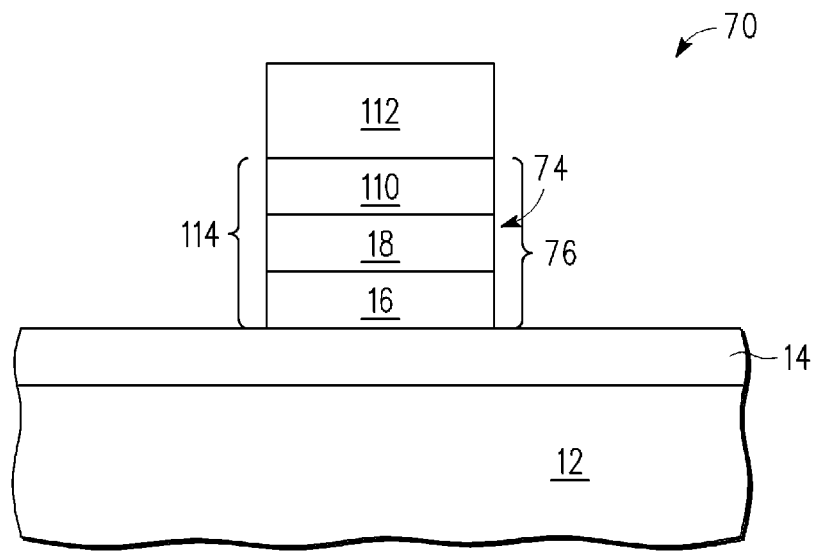
FIG. 7 includes an illustration of a cross-sectional view of a workpiece formed according to an alternative embodiment.

According to an alternative embodiment, an STMRAM cell can be formed with a portion of the tunnel barrier layer 18 removed such that the tunnel barrier layer 18 is substantially only exposed to subsequent processing along an edge. FIG. 7 includes an illustration of a workpiece 70, including a magnetic tunnel junction 76 of an STMRAM cell having an edge 74 formed by an alternative embodiment. The electrode layer 14, the electrode layer 112, and the magnetic stack 114, including the magnetic layer 16, the tunnel barrier layer 18, and the magnetic layer 110, are formed over the substrate 12 using an embodiment and including materials as previously described with respect to the corresponding layers of FIG. 1.

Portions of the electrode layer 112 and the magnetic stack 114 are removed as previously described in an embodiment with respect to FIG. 2, except that more layers of the magnetic stack 114 are removed while forming a magnetic tunnel junction 76 with the edge 74. In the illustrated embodiment, after removing the portion of the magnetic stack 114, the remaining portion of the magnetic stack 114 lies between the electrode layer 112 and the electrode layer 14, and forms the magnetic tunnel junction 76, as illustrated in FIG. 7.

Figure 8:
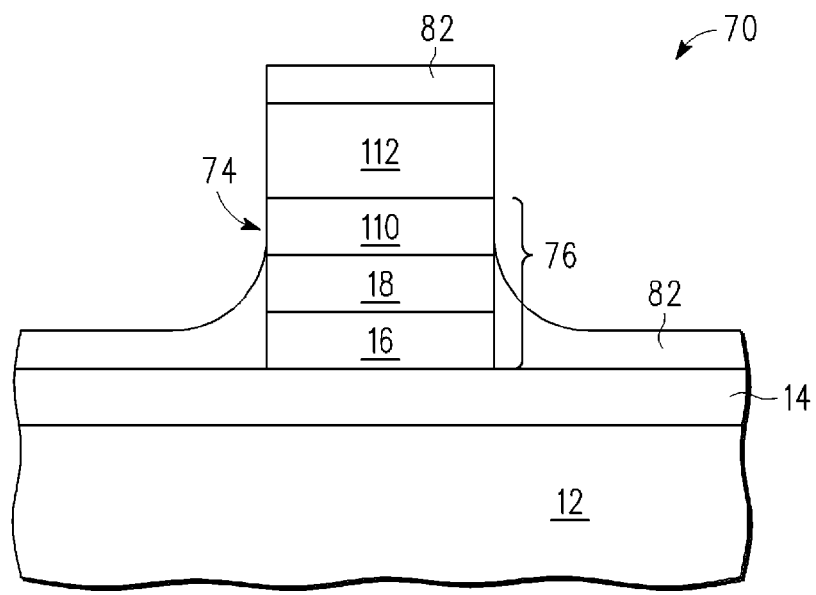
FIG. 8 includes an illustration of a cross-sectional view of the workpiece of FIG. 7 after forming a gettering layer.

FIG. 8 includes an illustration of the workpiece 70 after forming a gettering layer 82. The gettering layer 82 can then be formed using a material and according to an embodiment previously described with respect to the gettering layer 32. The gettering layer 82 can use the same or a different material or embodiment than the gettering layer 32. In a particular embodiment, the workpiece 70 is sputter-cleaned prior to forming the gettering layer 82. The gettering layer 82 is deposited over the workpiece 70 by sputtering material for the gettering layer 82 at an acute angle to a major surface of the workpiece 70 so that deposition occurs along a wall of the magnetic tunnel junction 76 at the edge 74. In a more particular embodiment, the gettering layer 82 is deposited such that after depositing the gettering layer 82, the tunnel barrier layer 18 at the edge 74 is substantially covered by the gettering layer 82.

Figure 9:
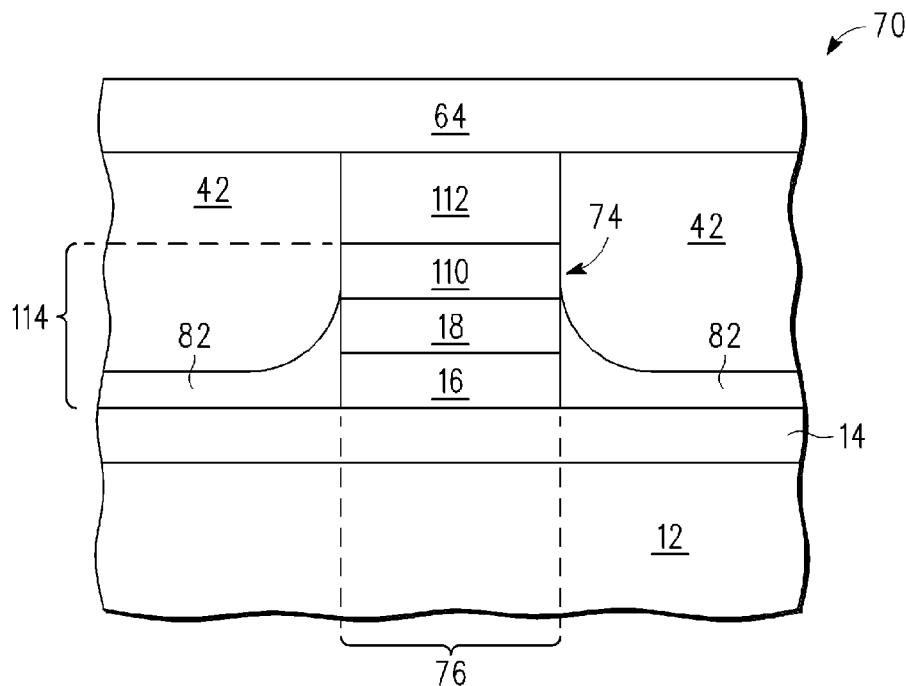
FIG. 9 includes an illustration of a cross-sectional view of the workpiece of FIG. 8 after forming an interconnect layer electrically connected to the second electrode layer.
Figure 10:
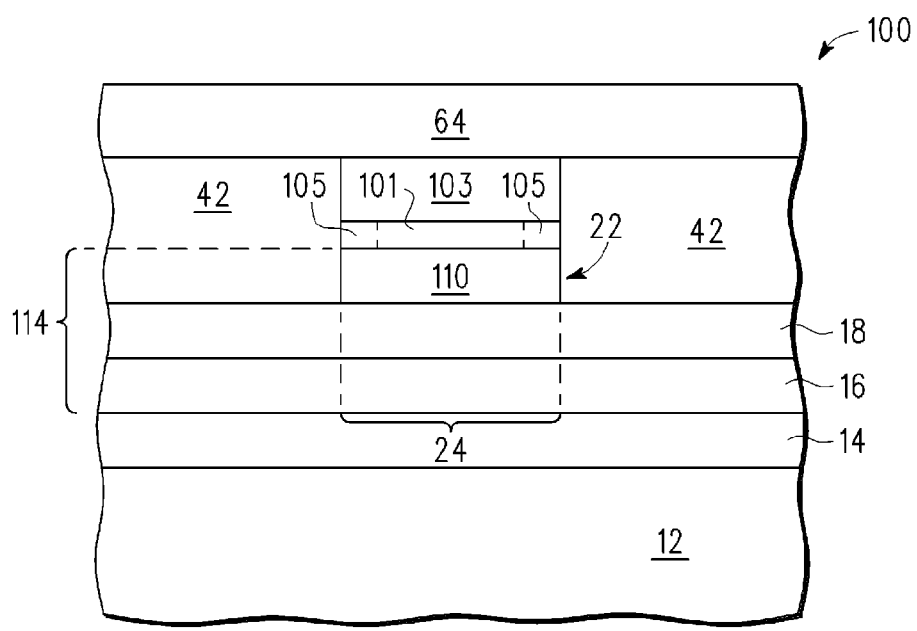
FIG. 10 includes an illustration of a cross-sectional view of another workpiece including a gettering layer between an electrode and a magnetic tunnel junction, formed according to another alternative embodiment.

FIG. 9 includes an illustration of the workpiece 70 after forming the insulating layer 42 and the interconnect layer 64, and substantially converting the gettering layer 82 to an insulating material. The insulating layer 42 can be deposited over the workpiece 70 and the workpiece 70 can be annealed by an embodiment previously described with respect to the workpiece 10 of FIG. 5. A portion of the gettering layer 82 overlying the electrode layer 112 is removed to expose the electrode layer 112 within an opening in the insulating layer 42. After removing the portion of the gettering layer 82 and annealing the workpiece 70, the gettering layer 82 can be substantially completely converted to an insulating material. After annealing the workpiece 70, ideally, the tunnel barrier layer 18 can have substantially the same active area as the initial active area. In one embodiment, a relatively small amount of the tunnel barrier layer 18 may be oxidized, and a difference between the initial active area and the post-anneal active area is not more than approximately 10 percent. The interconnect layer 64 is formed and processing can continue by an embodiment described above, to form a substantially complete electronic device.

In another alternative embodiment, a gettering layer can be formed between the magnetic stack and a subsequently formed electrode layer and serve as an electrical connection between a magnetic tunnel junction and an electrode. The gettering layer is formed using a conductive material. A portion of the gettering layer exposed along an edge of a subsequently formed magnetic tunnel junction can react or otherwise interact with a portion of available reactants adjacent to the tunnel barrier layer 18. In one embodiment, illustrated in FIG. 10, forming a workpiece 100 includes forming a gettering layer 101 over the magnetic stack 114 and adjacent to the tunnel barrier layer 18 before forming an electrode layer 103. The electrode layer 14 and magnetic stack 114 are formed by an embodiment previously described with respect to the workpiece 10 and the FIG. 1. In the illustrated embodiment, the gettering layer 101 is deposited over the magnetic stack prior to forming the electrode layer 103 over the magnetic stack 114.

The gettering layer 101 includes a conductive material. In one embodiment, the gettering layer 101 includes a metal. The gettering layer 101 can be formed by an embodiment and have a thickness as previously described with respect to the gettering layer 32. The gettering layer 101 can include the same or a different material as the gettering layer 32. In a particular embodiment, the gettering layer 101 is capable of gettering oxygen.

A portion of the electrode layer 112 and the magnetic stack 114 are removed as previously described in an embodiment with respect to FIG. 2, except that a portion of the gettering layer 101 is also removed in the process of forming a magnetic tunnel junction 24 with an edge 22. After removing a portion of the magnetic stack 114 and removing a portion of the gettering layer 101, the remaining portion of the gettering layer 101 extends to the edge 22 of the magnetic tunnel junction 24. In a particular embodiment, an edge portion 105 of the gettering layer 101 is adjacent to the edge of the tunnel barrier layer 18 of the magnetic stack 114, such that the edge portion 105 of the gettering layer 101 can consume some reactants during subsequent processing that may otherwise react with a portion of the tunnel barrier layer 18 within the magnetic tunnel junction 24.

Processing of the workpiece 100 continues according to an embodiment previously described with respect to the workpiece 10, including forming the insulating layer 42, and forming the interconnect layer 64, and other exposure to high temperature processing steps. In a particular embodiment, after high temperature exposure, the edge portion 105 of the gettering layer 101 consists essentially of an insulating material and a remaining portion of the gettering layer 101 remains conductive. As illustrated, a portion of the gettering layer 101 that does not include the edge portion 105 remains conductive such that an electrical connection can be maintained between the electrode layer 103 and the magnetic tunnel junction 24 through the gettering layer 101. In another particular embodiment, the edge portion 105 includes a conductive material such that both the remaining portion of the gettering layer 101 and the edge portion 105 are conductive. Finally, the embodiment shown in FIG. 10 may also be modified to include a gettering layer similar to gettering layer 32. In this case, this additional gettering layer's effect will combine with that of the gettering layer 101.

Thus an STMRAM is formed including a magnetic tunnel junction with a portion lying within an opening in an insulating layer. A gettering layer can also be formed within the opening, and, after the gettering layer getters available material, the gettering layer includes an insulating portion. By forming a gettering layer that is capable of gettering a reactive species during processing, characteristic properties of a tunnel barrier layer including a partially reacted metal can be substantially preserved. In a particular embodiment, by selecting the gettering layer thickness such that the material of the gettering layer is substantially completely converted to an insulating material after high temperature exposure of the workpiece, the gettering layer can be formed including a conductive material that would otherwise provide a leakage path between structures.

An STMRAM can be programmed by allowing current to flow across the magnetic tunnel junction 24. For example, in the embodiment illustrated with respect to the workpiece 10, an isolation transistor (not illustrated) in series with the magnetic tunnel junction 24 is activated and an electron current is allowed to flow between the electrode layer 14 and the electrode layer 112. The magnetic layer 16 acts as a fixed layer and polarizes the current flowing from the electrode layer 14. Electrons emerging from magnetic layer 16 are spin polarized with a spin orientation in a same direction as the magnetic layer 16. Thus, the charges passing through the magnetic layer 110 have predominantly a spin orientation that matches the magnetization of the magnetic layer 16. As the spin polarized electrons impinge upon the magnetic layer 110, they reorient to become aligned with the magnetization of the magnetic layer 110. Each such electron deposits a small torque upon the magnetic layer 110. After sufficient current is passed through the magnetic layer 110, the electrons deposit sufficient torque to change the magnetization direction of the magnetic layer 110 and the magnetic layers 16 and 110 become matched to each other.

In another embodiment, the electron current is passed through the magnetic tunnel junction 24 in the opposite direction, from the electrode layer 112 to the electrode layer 14. Electrons with a spin orientation matching the magnetic layer 16, acting as the fixed layer, pass more easily through the magnetic layer 16, while electrons with an anti-parallel spin tend to be reflected back to and impinge upon the magnetic layer 110. Thus, while electron current is flowing through the magnetic tunnel junction 24 from the free layer towards fixed layer, the spin orientation of the reflected electrons is anti-parallel to the magnetization of the fixed layer. These reflected electrons exert a torque upon the magnetic layer 110 and with sufficient electron current may cause the magnetic layer 110 to reverse. Thus the magnetization of the magnetic layer 110 can be aligned opposite to that of the magnetic layer 16.

Reading the STMRAM cell can be accomplished by applying a read voltage across the magnetic tunnel junction 24 and measuring the current flow. Current flow is higher when the magnetization of the magnetic layer 110 is aligned to the magnetization of the magnetic layer 16 that when the magnetizations are anti-parallel. The read voltage is selected such that the change in device resistance due to magnetic orientation of the magnetic layer 110 in the magnetic tunnel junction 24 can be detected, but not so high as to affect the orientation of the magnetization of the magnetic layer 110 of the magnetic tunnel junction 24.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include forming a stack over a substrate, wherein forming the stack includes forming a tunnel barrier layer. The process can also include forming a gettering layer adjacent to the stack wherein the gettering layer has a composition capable of gettering oxygen.

In one embodiment of the first aspect, forming the stack includes forming a magnetic stack over the substrate, wherein forming the magnetic stack further includes forming a first magnetic layer prior to forming the tunnel barrier layer, and forming a second magnetic layer after forming the tunnel barrier layer. Forming the gettering layer includes forming the gettering layer over the magnetic stack. In a particular embodiment, forming the first magnetic layer includes forming a fixed layer, wherein the fixed layer has a magnetization fixed in a particular orientation. Forming the second magnetic layer includes forming a free layer, wherein the free layer has a magnetization in any one of a plurality of orientations.

In another particular embodiment of the first aspect, the process further includes removing a portion of the magnetic stack to expose a surface of the tunnel barrier layer, and removing a portion of the gettering layer, wherein after removing a portion of the magnetic stack, the gettering layer substantially extends to the edge of the magnetic stack. In still another particular embodiment, forming the gettering layer includes forming a gettering layer including a conductive material. In a more particular embodiment, after the portion of the gettering layer is substantially converted to the insulating material, the gettering layer consists essentially of a metal oxide.

In a further particular embodiment of the first aspect, forming the tunnel barrier layer includes forming a metal layer including magnesium, aluminum, titanium, hafnium, zirconium, tantalum, or any combination thereof, and oxidizing or nitridizing the metal layer. In still a further particular embodiment, the magnetic stack includes a magnetic tunnel junction of a spin-transfer magneto-resistive random access memory cell. In yet another further particular embodiment, forming the tunnel barrier layer includes forming the tunnel barrier layer having a first active area and a resistance-area product of not greater than approximately 100 $\Omega\text{-}\mu m^2$ as deposited. After annealing the substrate, the active portion of the tunnel barrier layer has a second active area, wherein a difference between the first active area and the second active area is not more than approximately 10 percent. In another particular embodiment, the process further includes removing an oxygen-containing material from an exposed surface over the magnetic stack prior to forming the gettering layer.

In a second aspect, a process of forming an electronic device can include forming a magnetic stack over a substrate, wherein forming the magnetic stack includes forming a tunnel barrier layer, forming a gettering layer adjacent to the magnetic stack, wherein the gettering layer includes a material capable of gettering oxygen, and depositing an insulating layer over the gettering layer. The process can further include exposing the magnetic stack to a high temperature higher than approximately 60° C., wherein after exposing the magnetic stack, a portion of the gettering layer is converted to an insulating material.

In one embodiment of the second aspect, the process further includes removing a portion of the magnetic stack to form a magnetic tunnel junction having an edge at which the tunnel barrier layer is exposed, and removing a portion of the gettering layer, wherein after removing a portion of the gettering layer and after removing a portion of the magnetic stack, the gettering layer substantially extends to the edge of the magnetic tunnel junction. In a particular embodiment, after removing the portion of the gettering layer, substantially none of the gettering layer overlies the magnetic tunnel junction portion of the magnetic stack. In a more particular embodiment, the process further includes forming a first electrode prior to forming the magnetic stack, wherein after forming the magnetic stack, the first electrode and the magnetic stack are electrically connected, forming a second electrode prior to depositing the insulating layer, wherein after removing a portion of the magnetic stack, the second electrode is electrically connected to the magnetic tunnel junction, and removing a portion of the insulating layer to expose the second electrode.

In a third aspect, an electronic device can include a tunnel junction including a tunnel barrier layer including a metal, wherein the metal is only partially oxidized, a portion of the tunnel barrier layer lies within the tunnel junction, and the portion of the tunnel barrier layer within the tunnel junction has a resistance-area product of not greater than approximately 100 $\Omega\text{-}\mu m^2$. The electronic device can also include a first insulating layer adjacent to the tunnel barrier layer and including an opening, wherein a portion of the tunnel junction lies within the opening, and a gettering layer adjacent to the tunnel junction, wherein a portion of the gettering layer lies within the opening in the first insulating layer.

In one embodiment of the third aspect, the tunnel junction includes a magnetic tunnel junction. In a particular embodiment, the magnetic tunnel junction includes a first magnetic layer having a magnetization orientation and an edge, wherein the edge defines a perimeter of the magnetic tunnel junction. In another embodiment, the gettering layer lies between the first insulating layer and the tunnel barrier layer. In still another embodiment, the gettering layer includes a metal, the edges of which may include a metal oxide. In yet another embodiment, the gettering layer and the tunnel barrier layer are substantially coextensive.

Note that not all of the activities described above in the general description or the examples are required, that a portion of a specific activity may not be required, and that one or more further activities may be performed in addition to those described. Still further, the order in which activities are listed are not necessarily the order in which they are performed.

After reading this specification, skilled artisans will be capable of determining which one or more activities or one or more portions thereof are used or not used and the order of such activities are to be performed for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of manufacturing an electronic device comprising:
    forming a first conductive layer over a substrate;
    forming a magneto-resistive random access memory cell stack over the first conductive layer, wherein forming the magneto-resistive random access memory cell stack includes:
        forming a first magnetic layer in electrical contact with the first conductive layer;
        forming a tunnel barrier layer over the first magnetic layer;
        forming a second magnetic layer over the tunnel barrier layer; and
        forming a second conductive layer in electrical contact with the second magnetic layer;
    etching a portion of the second magnetic layer to expose a portion of the tunnel barrier layer,
    forming a metal layer over the exposed portion of the tunnel barrier layer; and
    forming an insulating layer on the metal layer wherein the tunnel barrier and the insulating layer are separated by the metal layer,
    wherein, during or subsequent to forming the insulating layer, at least a portion of the metal layer disposed on the exposed portion of the tunnel barrier layer is converted into an insulating material.

2. The process of claim 1, wherein:
    forming the first magnetic layer includes forming a fixed layer, wherein the fixed layer has a magnetization fixed in a particular orientation; and
    forming the second magnetic layer includes forming a free layer, wherein the free layer has a magnetization in any one of a plurality of orientations.

3. The process of claim 1, wherein forming the tunnel barrier layer includes:
    forming a metal layer including magnesium, aluminum, titanium, hafnium, zirconium, tantalum, or any combination thereof.

4. The process of claim 1, wherein:
    forming the tunnel barrier layer and etching a portion of the second magnetic layer includes forming the tunnel barrier layer having a first active area and a resistance-area product of not greater than approximately 100 $\Omega\text{-}\mu m^2$ as deposited; and
    after annealing the substrate, the tunnel barrier layer has a second active area, wherein a difference between the first active area and the second active area is not more than approximately 10 percent.

5. The process of claim 1, further including removing an oxygen-containing material from the magneto-resistive random access memory cell stack prior to forming the metal layer.

6. The process of claim 1 further comprising:
    exposing the stack to a temperature higher than 60° C., wherein after exposing the stack, a portion of the metal layer is converted to an insulating material.

7. The process of claim 1 wherein the etching step further comprises:
    forming an edge of the second conductive layer and the second magnetic layer; and
    the forming a metal layer further comprises:
    forming the metal layer on the edge.

8. The process of claim 1 wherein the forming a metal layer further comprises:
    forming the metal layer over the second conductive layer; and
    further comprising after the forming an insulating layer:
    removing the metal layer over the second conductive layer.

9. The process of claim 1 wherein the etching step further comprises:
    etching the tunnel barrier layer and the first magnetic layer to expose the first conductive layer to form an edge of the second conductive layer, the second magnetic layer, the tunnel barrier layer, the first magnetic layer; and the forming a metal layer comprises forming on the edge and on the first conductive layer.

10. The process of claim 1 wherein forming the metal layer comprises forming a metal layer having a thickness in the range of 1.0 to 10.0 nm.

11. The process of claim 1 wherein the forming the metal layer comprises depositing at an incident angle to the substrate.

12. The process of claim 1 wherein the tunnel barrier layer and the metal layer comprise the same metal.

13. The process of claim 1 wherein the insulating layer is selected from the group consisting of an oxide, a nitride, an oxynitride, or a combination thereof.

14. The process of claim 5 wherein the removing an oxygen-containing material consists of sputtering.

* * * * *